(12) United States Patent
Waldrop et al.

(10) Patent No.: US 11,996,162 B2
(45) Date of Patent: May 28, 2024

(54) SYNCHRONOUS INPUT BUFFER ENABLE FOR DFE OPERATION

(71) Applicant: Micron Technology, Inc., Boise, ID (US)

(72) Inventors: William C. Waldrop, Allen, TX (US); Won Joo Yun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 132 days.

(21) Appl. No.: 17/831,251

(22) Filed: Jun. 2, 2022

(65) Prior Publication Data

US 2023/0395105 A1 Dec. 7, 2023

(51) Int. Cl.
*G11C 7/00* (2006.01)
*G11C 7/10* (2006.01)
*G11C 7/22* (2006.01)
*H03K 19/20* (2006.01)

(52) U.S. Cl.
CPC .......... *G11C 7/1084* (2013.01); *G11C 7/1087* (2013.01); *G11C 7/1093* (2013.01); *G11C 7/222* (2013.01); *H03K 19/20* (2013.01)

(58) Field of Classification Search
CPC ............ G11C 11/4096; G11C 11/4076; G11C 7/1066; G11C 11/4093; G11C 7/1039; G11C 7/10; G11C 7/1018; G11C 7/1021; G11C 7/103; G11C 7/1048; G11C 8/04; G11C 7/1006; G11C 7/1069; G11C 29/028; G11C 7/222; G11C 5/025; G11C 7/1033; G11C 7/1096; G11C 7/1093; G11C 11/406; G11C 7/1078; G11C 7/22; G11C 7/1042; G11C 7/1051; G11C 8/18; G11C 2207/002; G11C 7/1012; G11C 2207/107; G11C 8/06; G11C 16/102; G11C 2207/2245; G11C 29/02; G11C 29/50012; G11C 5/04; G11C 5/063; G11C 7/1045; G11C 7/1057; G11C 7/18; G11C 11/005; G11C 11/1693; G11C 11/2293; G11C 11/4082; G11C 11/4097; G11C 13/0004; G11C 13/0033; G11C 13/0061; G11C 2029/0411; G11C 2207/2281

See application file for complete search history.

(56) References Cited

U.S. PATENT DOCUMENTS 9,892,772 B2 * 2/2018 Song .................... G11C 29/023

OTHER PUBLICATIONS

"AMD Ryzen 6000 Series Processors with AMD Radeon Graphics for Mobile," https://web.archive.org/web/20220508204606/https://www.amd.com/en/processors/ryzen-mobile-for-creators, May 8, 2022, 7 pages.

* cited by examiner

*Primary Examiner* — Thong Q Le
(74) *Attorney, Agent, or Firm* — Fletcher Yoder, P.C.

(57) ABSTRACT

Systems and methods that may enable alignment of a receiver enable signal with one or more clocking signals. By aligning the receiver operations with the one or more clocking signals, a likelihood of a false or incorrect data capture may be reduced, which may improve operation of a memory system. Reducing a likelihood of incorrect data capture may increase an accuracy of a distortion correction operation of a decision feedback equalizer (DFE).

20 Claims, 10 Drawing Sheets

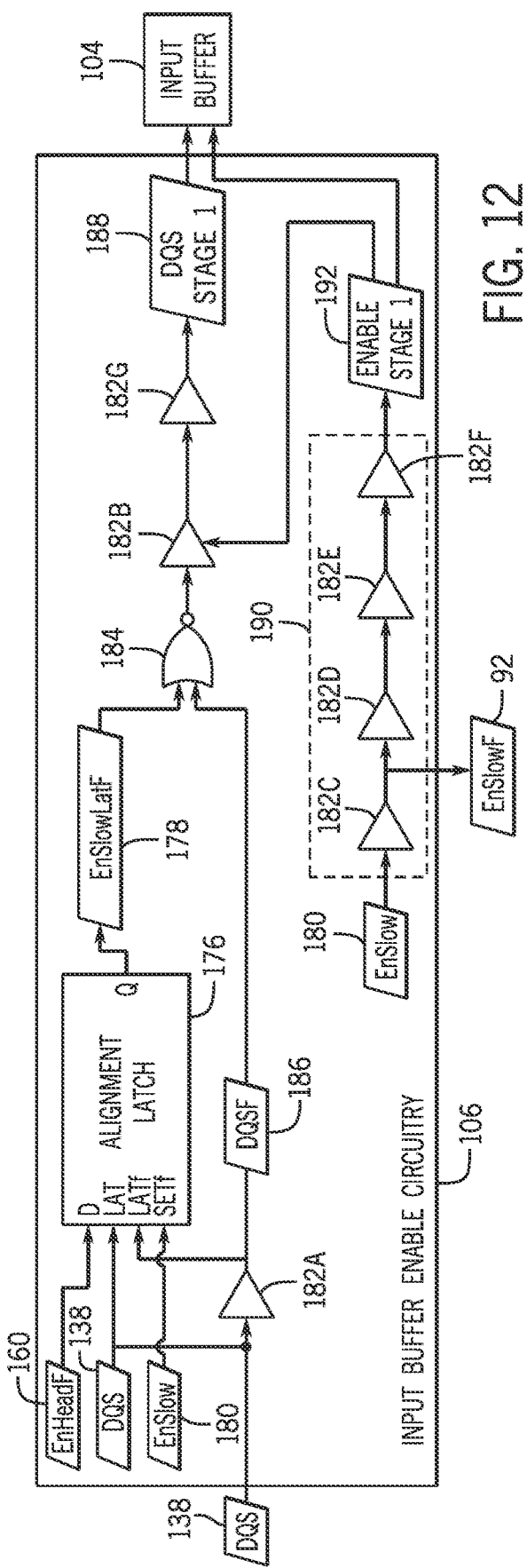
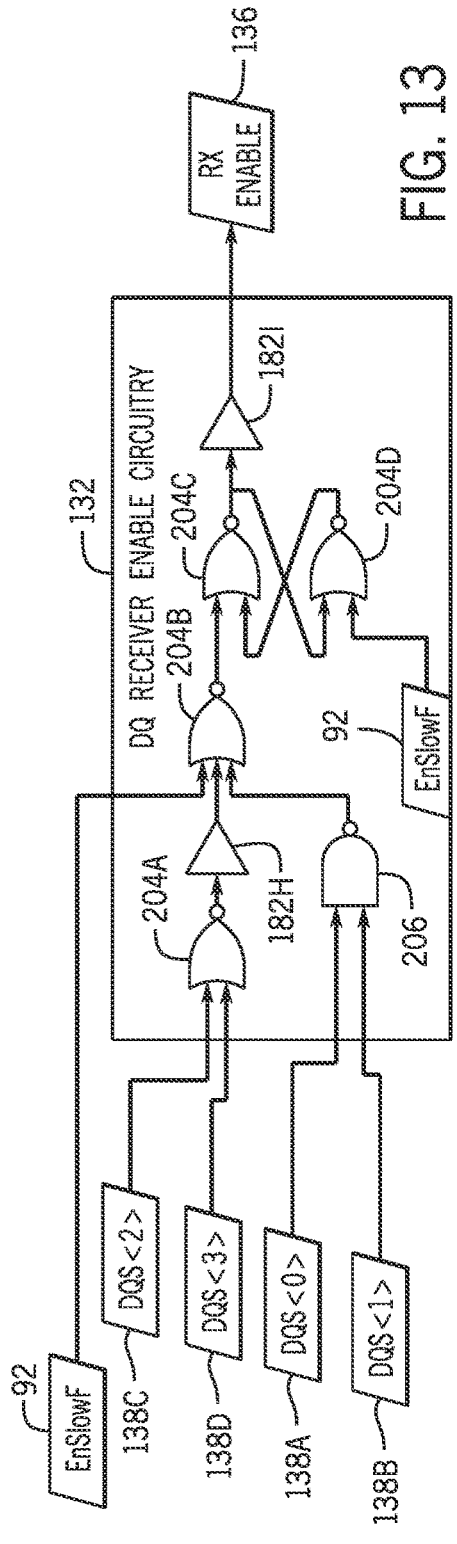
FIG. 12
FIG. 13

SYNCHRONOUS INPUT BUFFER ENABLE FOR DFE OPERATION

BACKGROUND

Field of the Invention

Embodiments of the present disclosure relate generally to the field of semiconductor memory devices. More specifically, embodiments of the present disclosure relate to using a decision feedback equalizer (DFE) circuit of a semiconductor memory device to correct distortions in transmitted signals.

Description of the Related Art

The operational rate of memory devices, including the data rate of a memory device, has been increasing over time. As a side effect of the increase in speed of a memory device, data errors due to distortion may increase. For example, inter-symbol interference between transmitted data whereby previously received data influences the currently received data may occur (e.g., previously received data affects and interferes with subsequently received data). One manner to correct for this interference is through the use of a decision feedback equalizer (DFE) circuit, which may be programmed to offset (i.e., undo, mitigate, or offset) the effect of the channel on the transmitted data.

Since correcting distortions in the transmitted signals continues to be important, timing and alignment issues between clock signals, enable signals, and data signals may be increasingly desired to be aligned, even more so when considering the increases in speeds of memory devices. Failure to align some of these signals may increase a likelihood of inaccurate or incorrect data captured as transmitted data to compensate for the effect of the channel on the transmitted data. Errors that result from clocks being misaligned from enable signals or other signals may cause additional distortions to the final data, thus reducing the reliability of data transmitted within the memory devices.

BRIEF DESCRIPTION OF THE DRAWINGS

Various aspects of this disclosure may better be understood upon reading the following detailed description and upon reference to the drawings in which:

FIG. 12 is a logic diagram of the input buffer enable circuitry of FIG. 11, according to an embodiment of the present disclosure;

FIG. 13 is a logic diagram of the receiver enable circuitry of FIG. 11, according to an embodiment of the present disclosure.

DETAILED DESCRIPTION

Figure 1:
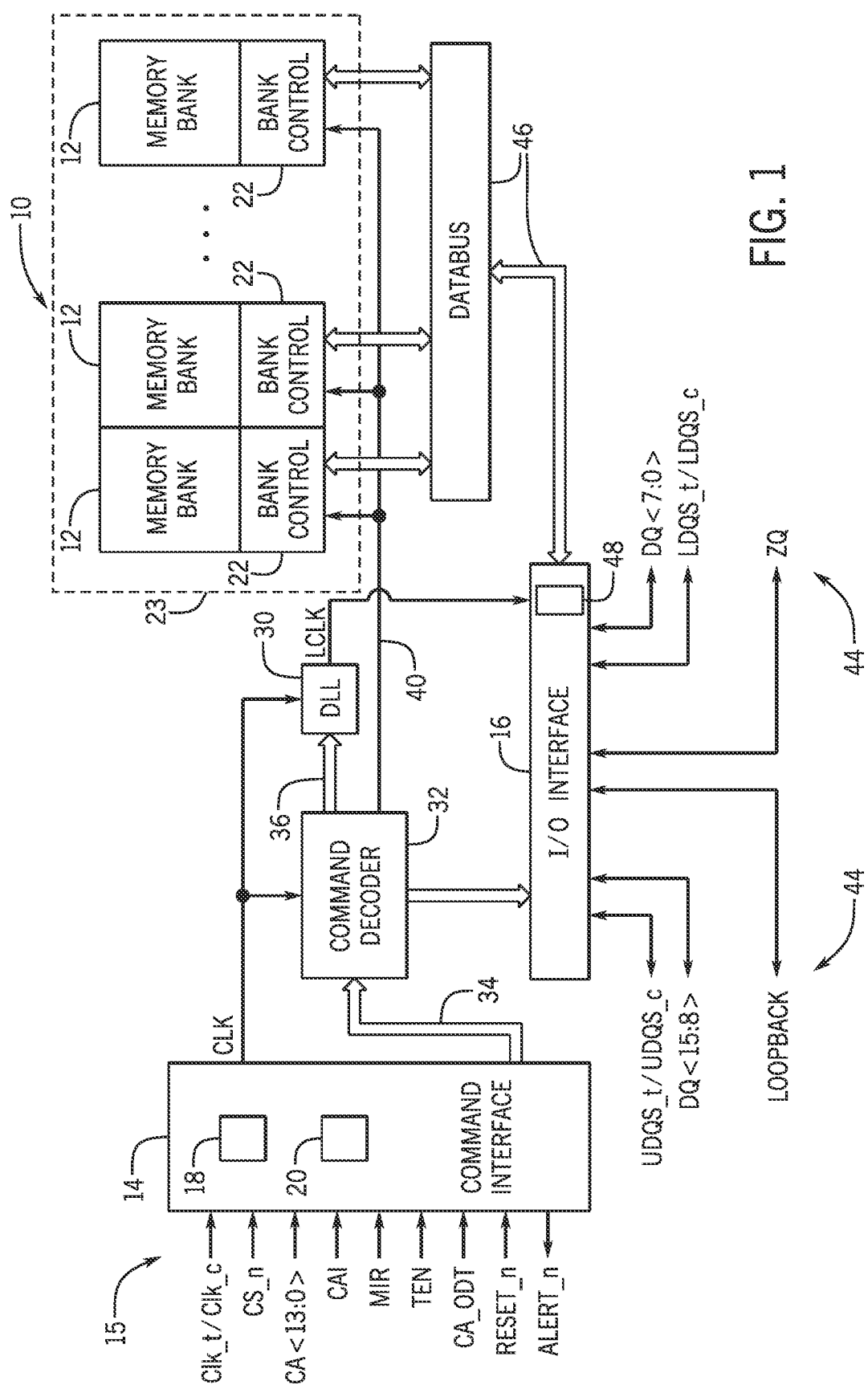
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Using a decision feedback equalizer (DFE) of a memory device to perform distortion correction techniques may be valuable, for example, to correctly compensate for distortions in the received data of the memory device. This insures that accurate values are being stored in the memory of the memory device. The DFE may use previous bit data to create corrective values to compensate for distortion resulting from the previous bit data. In some embodiments, the DFE may employ the use of multiple bits of previous data in order to precisely calculate the distortion correction factor. However, the accuracy and quality of the distortion correction operations of the DFE may be based on the accuracy of the previous bit data. This may leave the distortion correction operations vulnerable to misalignment, where an enable signal causing early latching of the previous bit data may compromise the accuracy of the previous bit data, and thus the distortion correction operations. It may be desired for a system (e.g., memory system) to include circuitry that improves alignment between the enable signal and one or more DQS signals used in transmitting data to and/or from the memory system.

To elaborate, a multi-rank memory system may include two or more memory ranks each corresponding to one or more memory banks, such as 8 memory banks each corresponding to 2 memory ranks. When performing non-continuous writes of either of the memory ranks, a non-synchronization condition may cause an asynchronous enable signal to trigger a data capture operation before each of the associated DQS signals are reset, yielding the incorrect data. The incorrect data captured may lead to generation of a false or incorrect tap history (e.g., incorrect data being latched as previously transmitted bits for use during the DFE operation). The distortion correction operation of the DFE may be based on an input buffer and a reference voltage of the input buffer may be set based on the tap history as part of the distortion correction operation. However, an incorrect tap history may similarly affect the reference voltage of the input buffer, which may cause the input buffer to use an incorrect reference voltage for a first data bit collection of a write operation. Thus, a false tap history may affect DFE operations by prematurely and/or inaccurately causing the reference voltage of the distortion correction operation to change, which may yield corrupted or incorrectly compensated data.

Systems and methods may be used to improve alignment of one or more enable signals to one or more data strobe (DQS) signals, which may reduce or eliminate a likelihood of incorrect data (e.g., false tap history) being latched as part of the DFE operation. The systems and methods may use input buffer enable circuitry, receiver enable circuitry, or both to reduce or eliminate a likelihood of an enable signal causing an early data capture operation that may generate the incorrect data. Aligning the enable signal relative to the one or more DQS signals may improve an efficiency of the system by processing received bits more quickly with higher accuracy levels than may be accomplished with other solutions that do not align the enable signal to each of the DQS signals.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. Collectively, the memory banks 12 and the bank control blocks 22 may be referred to as a memory array 23.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data bus 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate nonvolatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., not AND (NAND) memory, not OR (NOR) memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to allow a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. As will be appreciated, the host may include many other components, depending on the application of the host.

The host may operate to transfer data to the memory device 10 for storage and may read data from the memory device 10 to perform various operations at the host. Accordingly, to facilitate these data transmissions, in some embodiments, the I/O interface 16 may include a data transceiver 48 that operates to receive and transmit DQ signals to and from the I/O interface 16.

Figure 2:
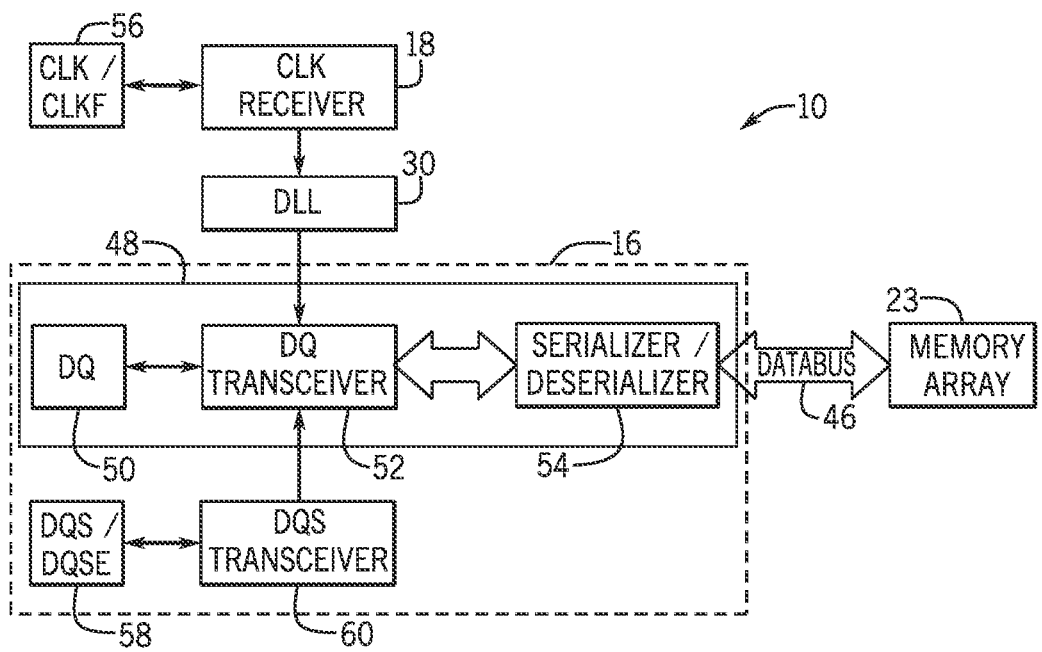
FIG. 2 is a block diagram illustrating a data transceiver of the I/O interface of FIG. 1, according to an embodiment of the present disclosure.

FIG. 2 illustrates the I/O interface 16 of the memory device 10 generally and, more specifically, the data transceiver 48. As illustrated, the data transceiver 48 of the I/O interface 16 may include a DQ pad 50, a DQ transceiver 52, and a serializer/deserializer 54. It should be noted that in some embodiments, multiple data transceivers 48 may be utilized that each single data transceiver 48 may be utilized in connection with a respective one of each of upper and lower I/O signals (e.g., DQ<15:8> and DQ<7:0>) corresponding to upper and lower bytes of the data signals, for instance. Thus, the I/O interface 16 may include a plurality of data transceivers 48, each corresponding to one or more I/O signals (e.g., inclusive of a respective DQ pad 50, DQ transceiver 52, and serializer/deserializer 54).

The DQ pad 50 may be, for example a pin, input pad, combination thereof, or another type of interface that operates to receive DQ signals, for example, for transmission of data to the memory array 23 as part of a data write operation.

Additionally, the DQ pad 50 may operate to transmit DQ signals from the memory device 10, for example, to transmit data from the memory array 23 as part of a data read operation. To facilitate these data reads/writes, a DQ transceiver 52 is present in data transceiver 48. In some embodiments, for example, the DQ transceiver 52 may receive a clock signal generated by the internal clock generator 30 as a timing signal for determining an output timing of a data read operation from the memory array 23. The clock signal transmitted by the internal clock generator 30 may be based upon one or more clocking signals received by the memory device 10 at clock connector 56 (e.g., a pin, pad, the combination thereof, etc.) and routed to the internal clock generator 30 via the clock input circuit 18. Thus, the DQ transceiver 52 may receive a clock signal generated by the internal clock generator 30 as a timing signal for determining an output timing of a data read operation from the memory array 23.

The DQ transceiver 52 of FIG. 2 may also, for example, receive one or more DQS signals to operate in strobe data mode as part of a data write operation. The DQS signals may be received at a DQS connector 58 (e.g., a pin, pad, the combination thereof, etc.) and routed to the DQ transceiver 52 via a DQS transceiver 60 that operates to control a data strobe mode via selective transmission of the DQS signals to the DQ transceiver 52. Thus, the DQ transceiver 52 may receive DQS signals to control a data write operation to the memory array 23.

As noted above, the data transceiver 48 may operate in modes to facilitate the transfers of the data to and from the memory device 10 (e.g., to and from the memory array 23). For example, to allow for higher data rates within the memory device 10, a data strobe mode in which DQS signals are utilized, may occur. The DQS signals may be driven by an external processor or controller sending the data (e.g., for a write command) as received by the DQS pad 58 (e.g., a pin, input pad, the combination thereof, etc.). In some embodiments, the DQS signals are used as clock signals to capture the corresponding input data.

In addition, as illustrated in FIG. 2, the data transceiver 48 also includes a serializer/deserializer 54 that operates to translate serial data bits (e.g., a serial bit stream) into a parallel data bits (e.g., a parallel bit stream) for transmission along data bus 46 during data write operations of the memory device 10. Likewise, the serializer/deserializer 54 operates to translate parallel data bits (e.g., a parallel bit stream) into serial data bits (e.g., a serial bit stream) during read operations of the memory device 10. In this manner, the serializer/deserializer 54 operates to translate data received from, for example, a host device having a serial format into a parallel format suitable for storage in the memory array 23. Likewise, the serializer/deserializer 54 operates to translate data received from, for example, the memory array 23 having a parallel format into a serial format suitable for transmission to a host device.

Figure 3:
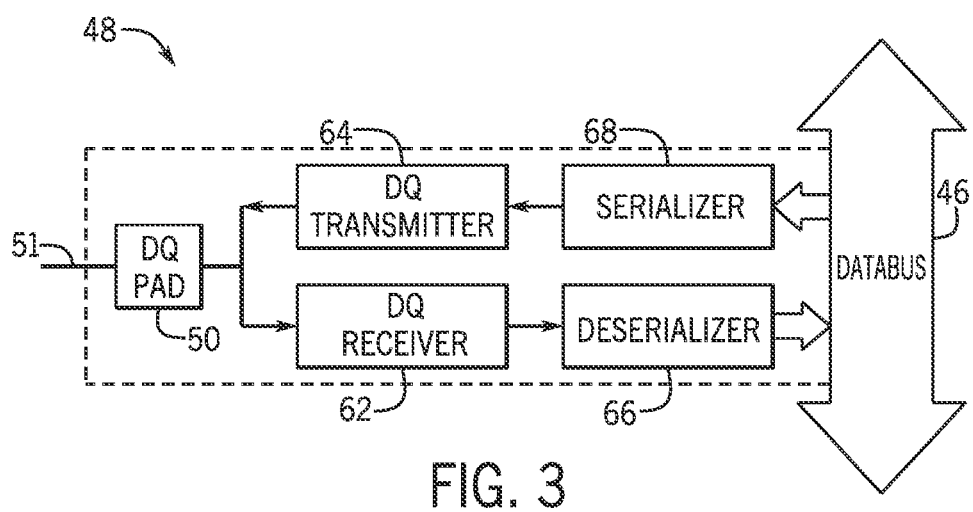
FIG. 3 is a block diagram of an embodiment of the data transceiver of FIG. 2, according to an embodiment of the present disclosure.

FIG. 3 illustrates the data transceiver 48 as including the DQ pad 50 coupled to data transfer bus 51, a DQ receiver 62, a DQ transmitter 64 (which in combination with the DQ receiver 62 forms the DQ transceiver 52), a deserializer 66, and a serializer 68 (which in combination with the deserializer 66 forms the serializer/deserializer 54). In operation, the host (e.g., a host processor or other memory device described above) may operate to transmit data in a serial form across data transfer bus 51 to the data transceiver 48 as part of a data write operation to the memory device 10. This data is received at the DQ pad 50 and transmitted to the DQ receiver 62. The DQ receiver 62, for example, may perform one or more operations on the data (e.g., amplification, driving of the data signals, etc.) and/or may operate as a latch for the data until reception of a respective DQS signal that operates to coordinate (e.g., control) the transmission of the data to the deserializer 66. As part of a data write operation, the deserializer 66 may operate to convert (e.g., translate) data from a format (e.g., a serial form) in which it is transmitted along data transfer bus 51 into a format (e.g., a parallel form) used for transmission of the data to the memory array 23 for storage therein.

Likewise, during a read operation (e.g., reading data from the memory array 23 and transmitting the read data to the host via the data transfer bus 51), the serializer 68 may receive data read from the memory array in one format (e.g., a parallel form) used by the memory array and may convert (e.g., translate) the received data into a second format (e.g., a serial form) so that the data may be compatible with one or more of the data transfer bus 51 and/or the host. The converted data may be transmitted from the serializer 68 to the DQ transmitter 64, whereby one or more operations on the data (e.g., de-amplification, driving of the data signals, etc.) may occur. Additionally, the DQ transmitter 64 may operate as a latch for the received data until reception of a respective clock signal, for example, from the internal clock generator 30, that operates to coordinate (e.g., control) the transmission of the data to the DQ pad 50 for transmission along the data transfer bus 51 to one or more components of the host.

Figure 4:
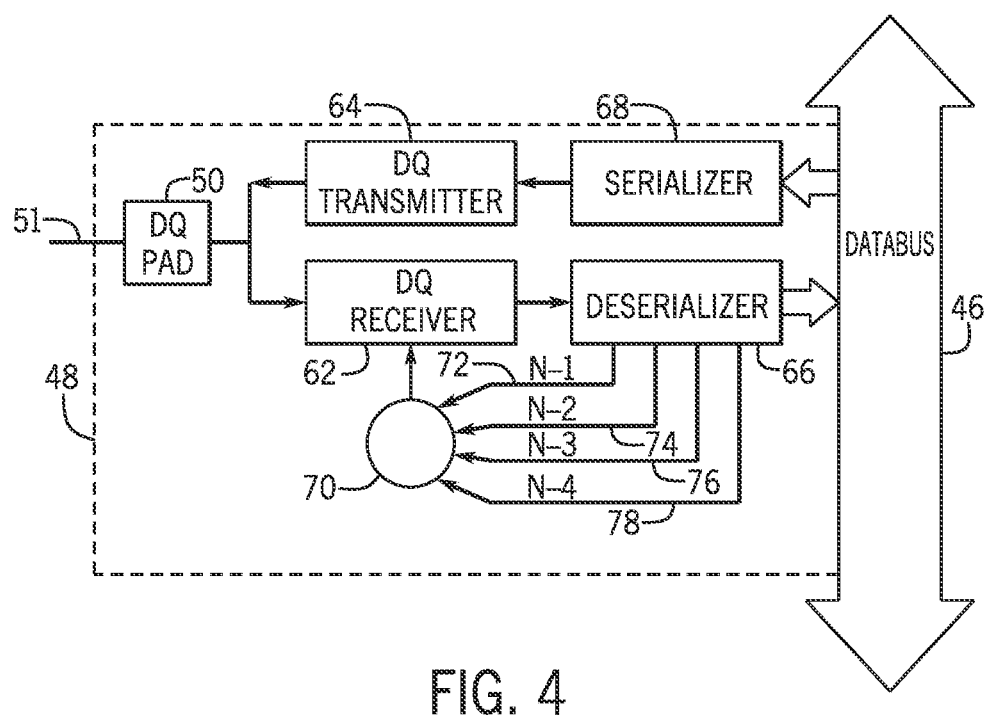
FIG. 4 is a block diagram of a second embodiment of the data transceiver of FIG. 2, according to an embodiment of the present disclosure.

In some embodiments, the data received at the DQ pad 50 may be distorted. For example, data received at the DQ pad 50 may be affected by inter-symbol interference (ISI) in which previously received data interferes with subsequently received data. For example, due to increased data volume being transmitted across the data transfer bus 51 to the DQ pad 50, the data received at the DQ pad 50 may be distorted relative to the data transmitted by the host. One technique to mitigate (e.g., offset or cancel) this distortion and to effectively reverse the effects of ISI is to apply an equalization operation to the data. FIG. 4 illustrates an embodiment of the data transceiver 48 inclusive of an equalizer that may be used in this equalization operation.

FIG. 4 illustrates one embodiment of the data transceiver 48 inclusive of an equalizer, in particular, a decision feedback equalizer (DFE) 70. As illustrated, the DFE 70 is a multi-tap (e.g., four-tap) DFE 70. However, less or more than four taps may be utilized in conjunction with the DFE 70. Likewise, the DFE 70 may be disposed separate from or internal to the deserializer 66 or the DQ receiver 62. In operation, a binary output (e.g., from a latch or decision-making slicer) or an indication of a binary output is captured in one or more data latches or data registers. In the present embodiment, these data latches or data registers may be disposed in the deserializer 66 and the values stored therein may be latched or transmitted along paths 72, 74, 76, and 78.

When a data bit is received at the DQ receiver 62, it may be identified as being transmitted from the host as bit "n" and may be received at a time to as distorted bit n (e.g., bit n having been distorted by ISI). The most recent bit received prior to distorted bit n being received at the DQ receiver 62, e.g., received at time of $t_{-1}$ that immediately precedes time of to, may be identified as n-1 and is illustrated as being transmitted from a data latch or data register along path 72. The second most recent bit received prior to distorted bit n being received at the DQ receiver 62, e.g., received at time of $t_{-2}$ that immediately precedes time of $t_{-1}$, may be identified as n-2 and is illustrated as being transmitted from a data latch or data register along path 74. The third most recent bit received prior to distorted bit n being received at the DQ receiver 62, e.g., received at time of $t_{-3}$ that immediately precedes time of $t_{-2}$, may be identified as n-3 and is illustrated as being transmitted from a data latch or data register along path 76. The fourth most recent bit received prior to distorted bit n being received at the DQ receiver 62, e.g., received at time of $t_{-3}$ that immediately precedes time of $t_{-2}$, may be identified as n-4 and is illustrated as being transmitted from a data latch or data register along path 78. Bits n-1, n-2, n-3, and n-4 may be considered the group of bits that interfere with received distorted bit n (e.g., bits n-1, n-2, n-3, and n-4 cause ISI to host transmitted bit n) and the DFE 70 may operate to offset the distortion caused by the group of bits n-1, n-2, n-3, and n-4 on host transmitted bit n.

Thus, the values latched or transmitted along paths 72, 74, 76, and 78 may correspond, respectively, to the most recent previous data values (e.g., preceding bits n-1, n-2, n-3, and n-4) transmitted from the DQ receiver 62 to be stored in memory array 23. These previously transmitted bits are fed back along paths 72, 74, 76, and 78 to the DFE 70, which operates to generate weighted taps (e.g., voltages) that may be added to the received input signal (e.g., data received from the DQ pad 50, such as distorted bit n) by means of a summer (e.g., a summing amplifier). In other embodiments, the weighted taps (e.g., voltages) may be combined with an initial reference value to generate an offset that corresponds to or mitigates the distortion of the received data (e.g., mitigates the distortion of distorted bit n). In some embodiments, taps are weighted to reflect that the most recent previously received data (e.g., bit n-1) may have a stronger influence on the distortion of the received data (e.g., distorted bit n) than bits received at earlier times (e.g., bits n-1, n-2, and n-3). The DFE 70 may operate to generate magnitudes and polarities for taps (e.g., voltages) due to each previous bit to collectively offset the distortion caused by those previously received bits.

For example, for the present embodiment, each of previously received bits n-1, n-2, n-3, and n-4 could have had one of two values (e.g., a binary 0 or 1), which was transmitted to the deserializer 66 for transmission to the memory array 23 and, additionally, latched or saved in a register for subsequent transmission along respective paths 72, 74, 76, and 78. In the illustrated embodiment, this leads to sixteen (e.g., $2^4$) possible binary combinations (e.g., 0000, 0001, 0010, . . . , 1110, or 1111) for the group of bits n-1, n-2, n-3, and n-4. The DFE 70 operates to select and/or generate corresponding tap values for whichever of the aforementioned sixteen combinations are determined to be present (e.g., based on the received values along paths 72, 74, 76, and 78) to be used to adjust either the input value received from the DQ pad 50 (e.g., distorted bit n) or to modify a reference value that is subsequently applied to the input value received from the DQ pad 50 (e.g., distorted bit n) so as to cancel the ISI distortion from the previous bits in the data stream (e.g., the group of bits n-1, n-2, n-3, and n-4).

Use of distortion correction (e.g., a DFE 70) may be beneficial such that data transmitted from the DQ pad 50 is correctly represented in the memory array 23 without distortion. Accordingly, it may be useful to store the previous bit data to use in the distortion correction. However, inaccuracies (e.g., incorrect data) in the captured previous bit data may affect future distortion correction operations and/or data stored in the memory.

Figure 5:
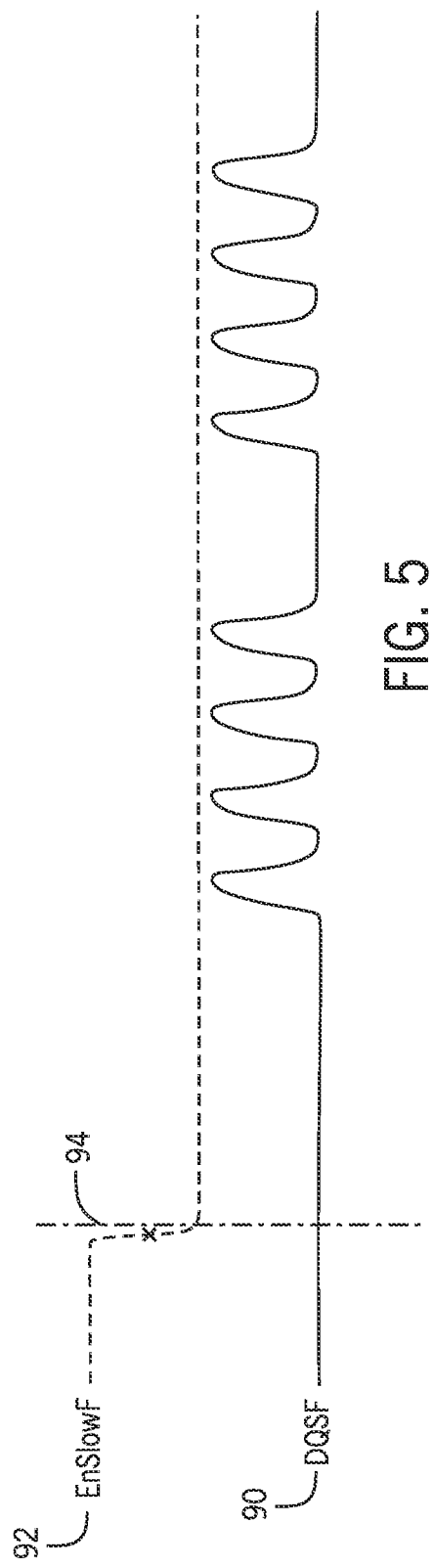
FIG. 5 is a timing diagram of waveforms associated with an example of inadvertent data capture of the memory device of FIG. 1 corresponding to an asynchronous input buffer operation, according to an embodiment of the present disclosure.

Keeping the foregoing in mind, some systems than include a DFE 70, like the memory device 10, may experience data input buffer timing issues when beginning to write to one rank (e.g., a first memory rank out of two total memory ranks). To illustrate, FIG. 5 is a timing diagram of waveforms associated with an example inadvertent data capture described above. Illustrated are example signals associated with asynchronous input buffer operation. An inverted DQS signal (DQSF) 90 may default to a logical low (e.g., "0," low reference voltage value) for some DQS phases (e.g., Phase360, Phase540) but default to a logical high value (e.g., "1," high reference voltage) when representative of different DQS phases (e.g., Phase0, Phase 180). Here, the DQSF 90 may correspond to DQS phases that default logical low.

When an input buffer enable signal (EnSlowF) 92 is not synchronized with the DQS signals, a write operation may enable an input buffer before the data channel is clear of previously transmitted data. For example, one or more bits of data associated with a first memory rank may remain in a data channel shared by two or more memory ranks for a duration of time after the first memory rank receives the one or more bits of data. When an input buffer is enabled in response to the EnSlowF 92 generated in response to a write operation of a second memory rank and the one or more bits of data remain in the data channel, the input buffer may inadvertently capture, at time 94, the one or more bits of data as opposed to the actual data intended during the write operation. This inadvertent data capture operation may skew values of data written to the second memory rank as the one or more bits captured by the input buffer may be used to adjust the values of data in future operations as part of the distortion correction operations described above. Inaccurate data storage and capture operations may be generally undesired due to skew and further propagation of the data errors, which may manifest as memory performance changes, system performance changes, data errors, or the like.

To remedy this, and to better align input buffer enabling with a DQS signal, input buffer enable control circuitry may be included in the DQ receiver 62. Furthermore, as described at least in FIG. 8, additional alignment may be made across multiple DQS signals (e.g., different DQS phases) by including DQ receiver enable circuitry in the memory device 10.

Figure 6:
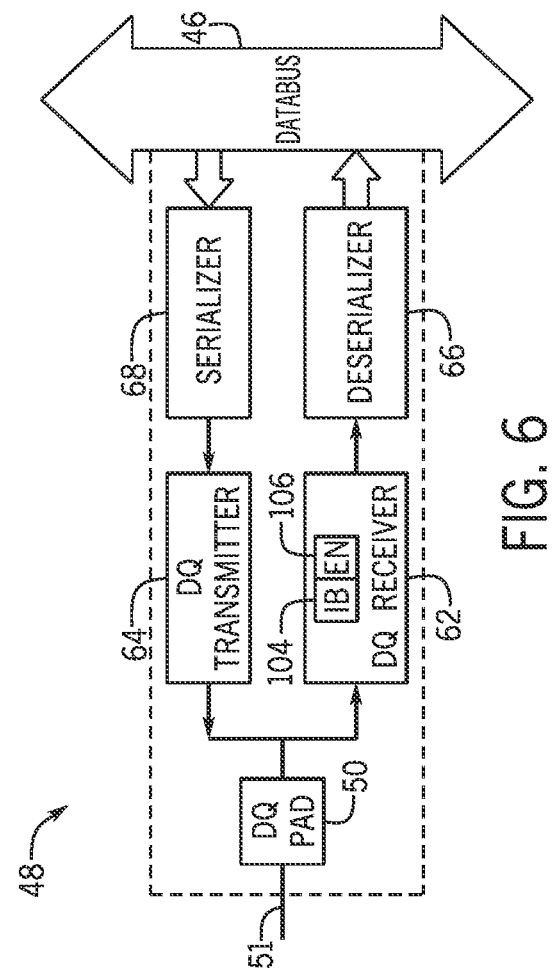
FIG. 6 is a block diagram of the data transceiver of FIG. 2 with an input buffer and input buffer enable circuitry, according to an embodiment of the present disclosure.

To elaborate, FIG. 6 is a block diagram of the data transceiver 48 of FIG. 2 with an input buffer 104 and input buffer enable circuitry 106. The input buffer enable circuitry 106 may enable the input buffer 104 to capture the data received at the DQ pad 50 in response to a reset of a corresponding DQS signal (not illustrated). As will be appreciated, this selective turning on of or connecting of the input buffer 104 (to the DQ pad 50) may help prevent incorrect data sampling by tying the sampling of the value at the DQ pad 50 to a suitable combination of signals that includes the DQS signal having the reset value. Selectively turning on the input buffer 104 may have additional power saving benefits by reducing an amount of power consumed by the input buffer 104 while the input buffer 104 is idle between memory operations.

Figure 7:
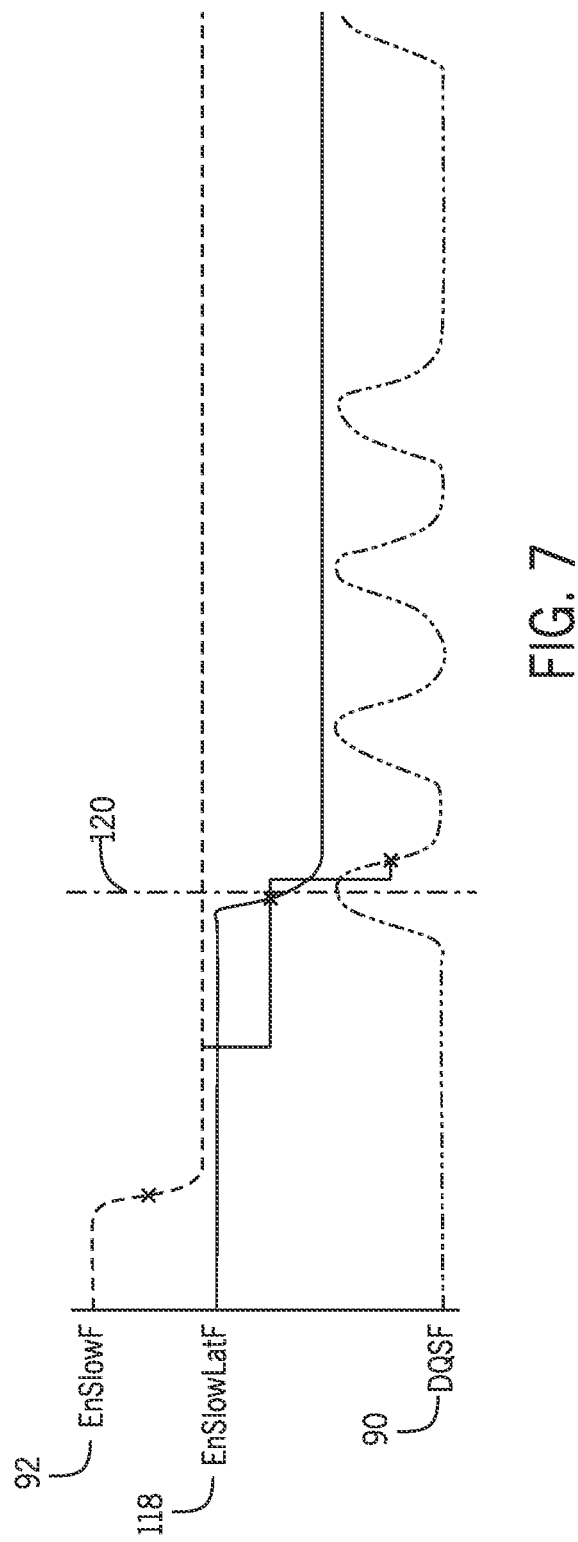
FIG. 7 is a timing diagram of waveforms associated with an example of data capture of the memory device of FIG. 1 corresponding to a synchronous input buffer operation, according to an embodiment of the present disclosure.

By delaying activation of the input buffer 104, a likelihood of an incorrect or false data sample by the input buffer 104 may be reduced or eliminated, thereby improving operation of the memory device 10. For example, FIG. 7 is a timing diagram of waveforms associated with synchronous input buffer operation. Here, like in FIG. 5, the DQSF 90 may correspond to DQS phases that default logical low. However, in contrast to the waveforms of FIG. 5, due at least in part to the systems and methods described in FIG. 6 (e.g., inclusion of the input buffer enable circuitry 106), a slow enable inverted signal (EnSlowLatF) 118 transmitted is a slowed version of the EnSlowF 92 propagated in alignment with the DQSF 90 and/or each of the DQS signals of the memory device 10. The EnSlowLatF 118 may not transition low until the DQSF 90 transitions high at time 120. This delay may synchronize the input buffer 104 with the clocking operations and the current write operation.

Figure 8:
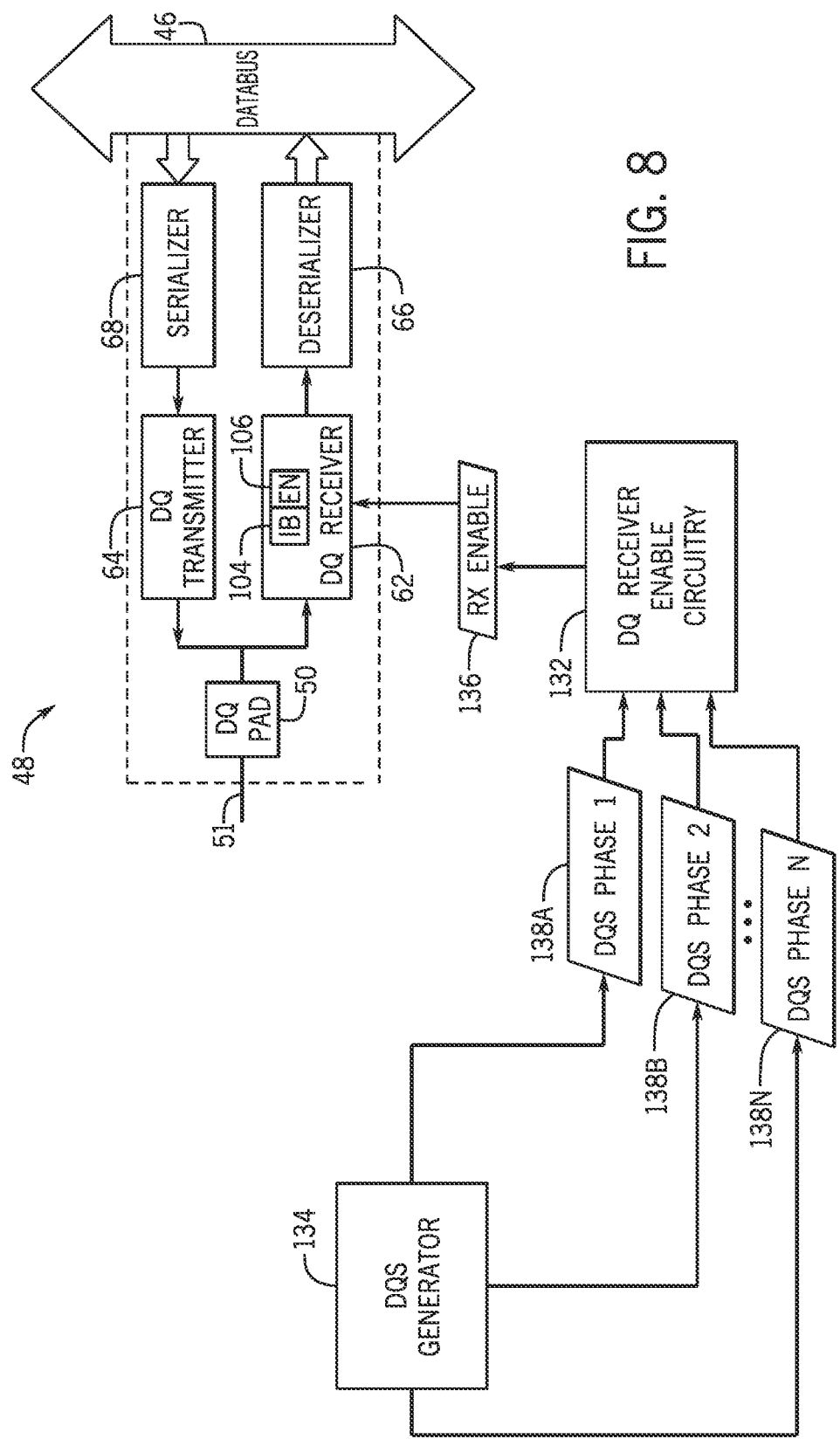
FIG. 8 is a block diagram of the data transceiver of FIG. 6 with receiver enable circuitry, according to an embodiment of the present disclosure.

A memory device 10 where timing of write operations are expected to occur such that DQS signals are able to be reset may benefit from the memory device 10 of FIG. 6. However, in some memory devices 10, additional delay operations may be desired. To elaborate, FIG. 8 is a block diagram of the data transceiver 48 of FIG. 2 with DQ receiver enable circuitry 132, the input buffer 104 of FIG. 6, and the input buffer enable circuitry 106 of FIG. 6.

A DQS generator 134 may generate the DQS signals 138 and may reset the DQS signals 138 to a default value (e.g., logic low for DQS<2:3> and logic high for DQS<0:1>) in response to issued memory commands. The DQS generator 134 may be disposed outside the memory device 10. The DQS generator 134 may be hardware or software of a larger host device that generates the DQ signals received at the DQ pad 50. In some cases, the DQS generator 134 is or is part of a memory controller that controls operations of the memory device 10.

Depending on the write operations that have occurred before the input buffer 104 is disabled, the DQS generator 134 of the memory device 10 may be in a state that is opposite the reset state and therefore may not output DQS signals in a reset state. This condition may occur when there is an odd number of DQS signal toggles during write bursting before the input buffer is disabled. The concern may be that if the data input buffer is disabled for a shorter duration of time than a duration of time used by the DQS generator 134 to reset the DQS signals 138, an enable signal from the input buffer enable circuitry 106 of FIG. 6 may enable the input buffer 104 before the reset occurs, which may result in similar false data capturing. Thus, in some devices it may be desired to include additional DQ receiver enable circuitry 132 to delay enabling of the DQ receiver 62 until each of the DQS signals are reset to compensate for this condition.

Indeed, to align the input buffer 104 with multiple DQS signals, the DQ receiver enable circuitry 132 may transmit a receiver (RX) enable signal 136 based on each DQS signal 138 transmitted to it (e.g., DQS phase 1 138A, DQS phase 2 138B, . . . DQS phase N 138N). The DQ receiver enable circuitry 132 may delay enabling the input buffer 104 for a current write operation until each of the DQS signals are reset in preparation for the current write operation.

Figure 9:
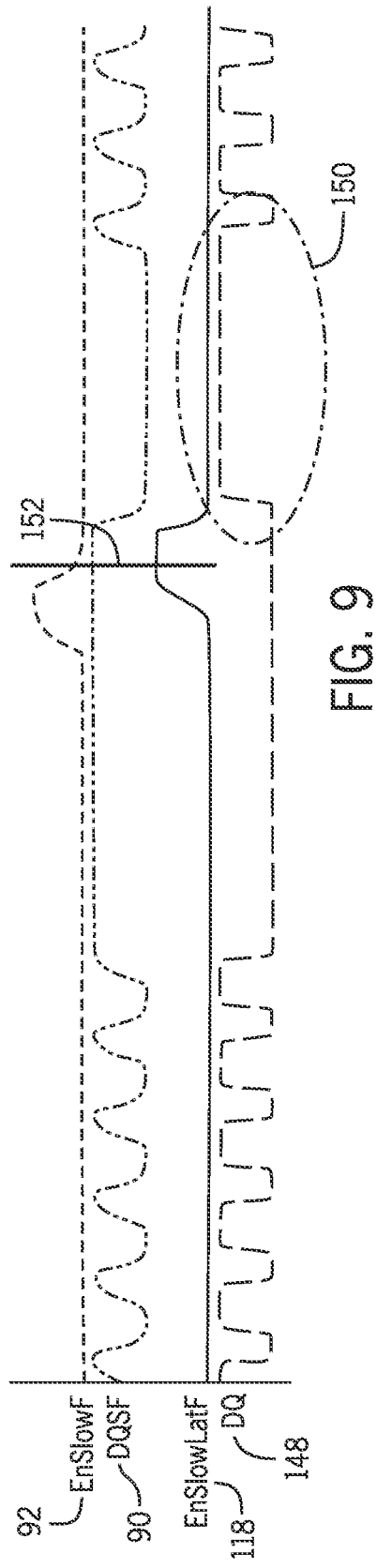
FIG. 9 is a timing diagram of waveforms associated with an of example inadvertent data capture of the memory device of FIG. 1, according to an embodiment of the present disclosure.
Figure 10:
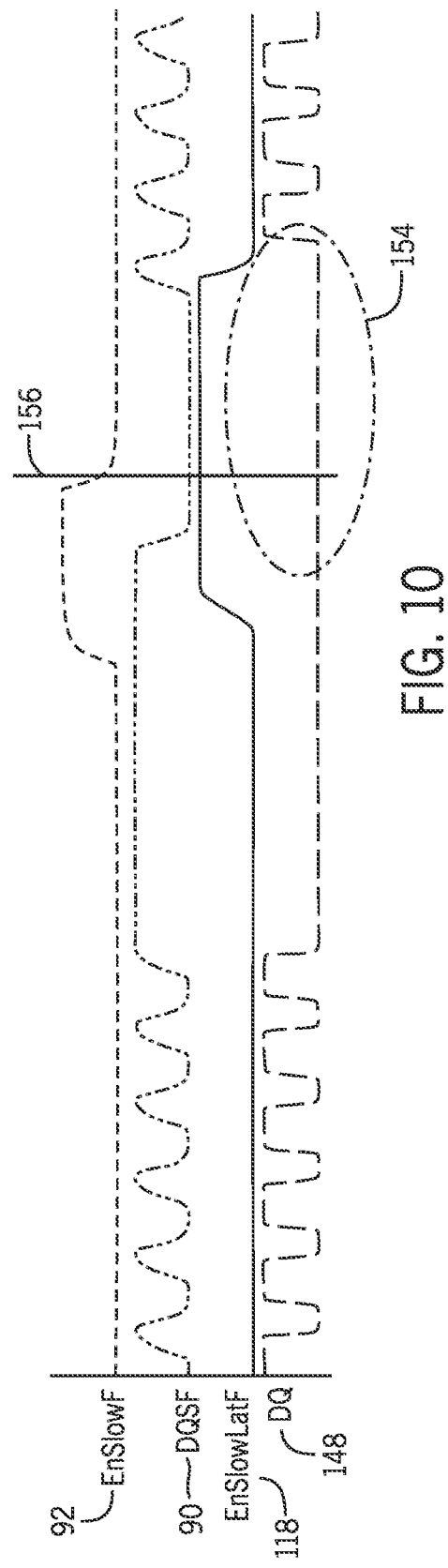
FIG. 10 is a timing diagram of waveforms associated with an example of data capture of the memory device of FIG. 1 corresponding to a synchronous input buffer operation, according to an embodiment of the present disclosure.

By delaying activation of the input buffer 104, a likelihood of an incorrect or false data sample by the input buffer 104 may be reduced or eliminated, thereby improving operation of the memory device 10. To elaborate, FIGS. 9-10 illustrate timing diagrams of example EnSlowF 92, a DQSF signal 90, EnSlowLatF 118, and a DQ signal 148 before (e.g., FIG. 9) and after (e.g., FIG. 10) including the circuitry of FIG. 8 in the memory device 10. FIGS. 9-10 are described together for ease of understanding. Indeed, FIG. 9 illustrates how incorrect data 150 may be captured based on the EnSlowF 92 when the DQ receiver enable circuitry 132 is omitted from the memory device 10. The EnSlowF 92 is disabled an amount of time less than an amount of time used by the memory device 10 to reset the DQSF signal 90 (e.g., illustrated by falling edge 152 overlapping a duration of time that the DQSF signal 90 is a logic high and is reset to a logic low). However, FIG. 10, illustrates how the incorrect data 150 may be omitted (e.g., omitted at reference arrow 154)

when the DQ receiver enable circuitry 132 is included in the memory device 10. By disabling the EnSlowF 92 for an amount of time greater than the amount of time used by the memory device 10 to reset the DQSF signal 90 (e.g., illustrated by falling edge 156 overlapping a duration of time that the DQSF signal 90 is a logic low and is reset to a logic low), the correct data may be latched by the input buffer 104.

Keeping the foregoing in mind, particular description is made to an example memory device 10 that may perform a write operation to one of at least two memory ranks based on four DQS phases and four DQ signals. However, it should be understood that these systems and methods may be used in memory devices 10 that use any suitable number of memory ranks, DQS signals, DQ signals, or the like. For example, these operations may scale down to a 2 DQS signal system and up to an 8 DQS signal system.

Figure 11:
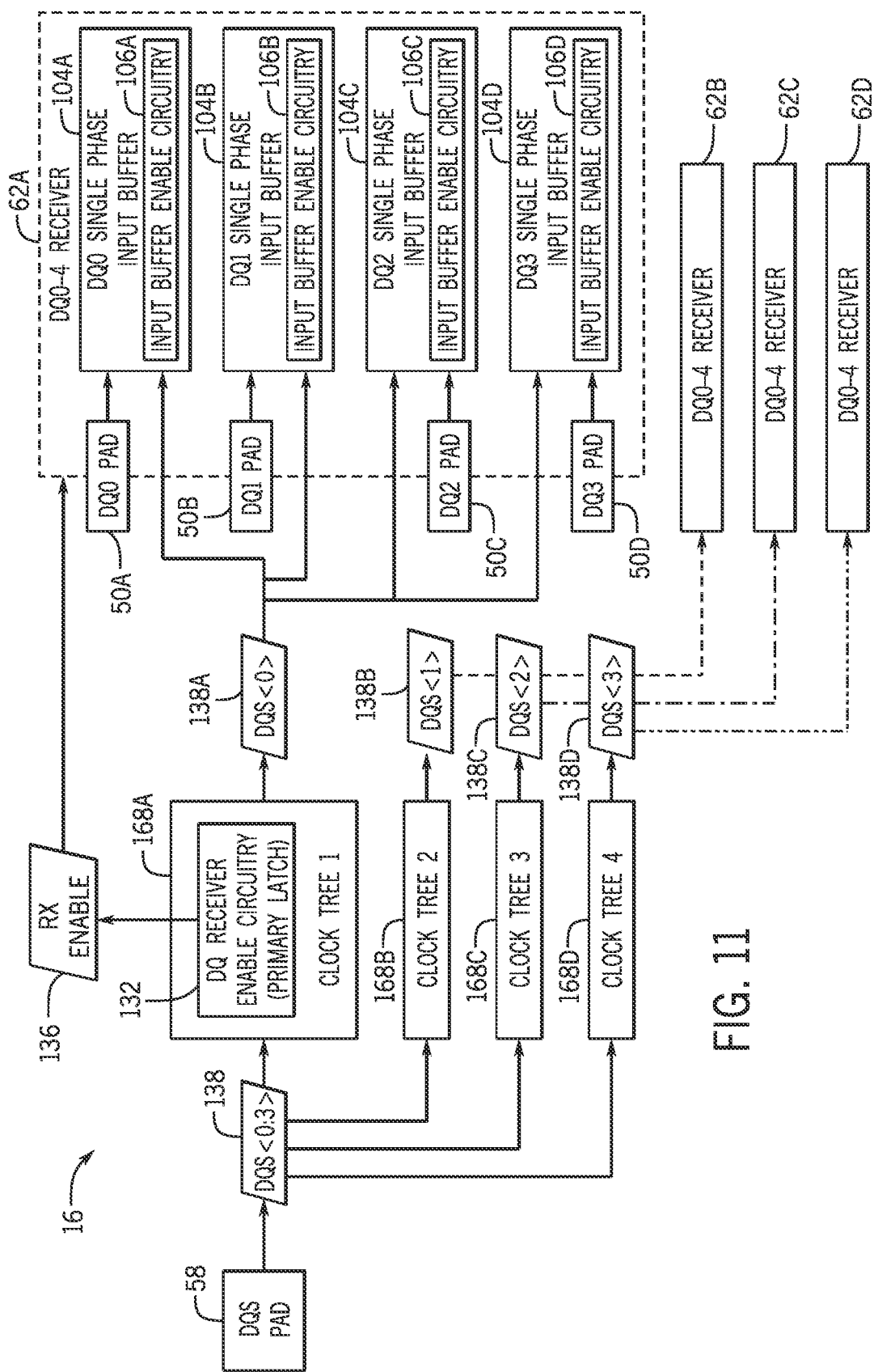
FIG. 11 is a block diagram of input/output (I/O) interface circuitry of FIG. 1 with receiver enable circuitry and input buffer enable circuitry of FIGS. 6 and 8, according to an embodiment of the present disclosure.

FIG. 11 is a block diagram of an example I/O interface 16 of the memory device 10. The I/O interface 16 includes a DQS pad 58 to receive four DQS signals 138. It is noted that the I/O interface 16 may include additional circuitry to the DQS pad 58, such as DQS input interface circuitry, the DQS transceiver 60, circuitry described earlier relative to FIGS. 1-4, or the like. The DQS signals 138 may transmit to one or more clock trees 168 (clock tree 168A, clock tree 168B, clock tree 168C, clock tree 168D). Each of the clock trees 168 (e.g., clock distribution circuitry) may receive each of the DQS signals 138 and may distribute the DQS signals 138 to one or more DQ receivers 62 (represented collectively here as DQ0-4 receiver 62). The clock trees 168 may compensate for timing delays when transmitting the various DQS signals 138 to preserve timing representative of the timing of the DQS signals 138 when received at the DQS pad 58.

Since each clock tree 168 corresponds to a different combination of DQ receivers 62, the DQ receiver enable circuitry 132 may be included in each of the clock trees 168. Furthermore, each of the clock trees 168 may output respective DQS signals to a corresponding DQ0-4 receiver 62. Each respective DQ receiver enable circuitry 132 may enable its corresponding DQ0-4 receiver 62 based on the corresponding subset of the DQS<0:3> signals 138. For example, the clock tree 168A corresponds to DQ0-4 receiver 62A and DQS<0> signals 138A, the clock tree 168B corresponds to DQ0-4 receiver 62B and DQS<1> signals 138B, the clock tree 168C corresponds to DQ0-4 receiver 62C and DQS<2> signals 138C, and the clock tree 168D corresponds to DQ0-4 receiver 62D and DQS<3> signals 138D.

Here, as a representative example of the other DQS phases, a DQS<0> signal 138 received as part of the DQS<0:3> signals 138 is respectively sent to each of a DQ0 single phase input buffer 104A, a DQ1 single phase input buffer 104B, a DQ2 single phase input buffer 104C, and a DQ3 single phase input buffer 104D. Respective input buffer enable circuitry 106 receives the DQS<0> signal 138A and may enable the corresponding input buffer 104 in response to the the DQS<0> signal 138. For example, the input buffer enable circuitry 106A may enable the DQ0 single phase input buffer 104A in response to the DQS<0> signal 138A, the input buffer enable circuitry 106B may enable the DQ0 single phase input buffer 104B in response to the DQS<0> signal 138A, the input buffer enable circuitry 106C may enable the DQ0 single phase input buffer 104C in response to the DQS<0> signal 138A, and the input buffer enable circuitry 106D may enable the DQ0 single phase input buffer 104D in response to the DQS<0> signal 138A. This may enable DQ signals received at respective DQ pads 50 (DQ0 pad 50A, DQ1 pad 50B, DQ2 pad 50C, DQ3 pad 50D) to be latched by the input buffer 104 synchronous with the DQS<0> signal.

To elaborate further on the input buffer enable circuitry 106, FIG. 12 is a logic diagram of example circuitry used as the input buffer enable circuitry 106. It is noted that although represented as including a certain combination of NAND, NOR, OR, and inverter logic gates, any suitable or equivalent combinational circuitry may be used. Furthermore, since the input buffer enable circuitry 106 may be used for each DQS signal 138 respectively, the specific phase of the DQS signal 138 is not used when describing this circuitry and instead is referred to as "DQS" and/or "DQSF" for the inverted version of a DQS signal 138.

As illustrated in FIG. 11, the input buffer enable circuitry 106 may receive a DQS signal 138. The DQS signal 138 may be received from one of the clock trees 168 (e.g., the clock tree 168 corresponding to the input buffer enable circuitry 106). A latch 176 (e.g., an alignment latch) may receive a clocking transition of the DQS signal 138 and may change state of an output enable slow latch inverse signal (EnSlowLatF) 178 in response to a transition (e.g., a rising edge) of a slow enable control (EnSlow) 180 signal. The latch 176 may include several inputs and an output (Q). The latch 176 may include a data input (D) to receive a EnHeadF signal 160, a latch input (LAT) to receive the DQS signal 138, a latch inverted input (LATf) to receive the DQS signal 138 inverted by inverter 182A, and a set input (SETf) to receive the EnSlow 180 signal that operates the latch 176 to asynchronous set when the EnSlow 180 signal has a low voltage value. The EnSlow 180 signal may be used to generate another enable signal (EnHeadF) 160, such as by transmitting the EnSlow 180 signal through one or more inverters to delay and invert the EnSlow 180 signal (e.g., three inverters). The DQS signal 138 may be inverted at inverter 182A and transmitted to a not OR (NOR) gate 184 and to the latch 176. The NOR gate 184 generates a logic low value until the DQSF 186 signal and the EnSlowLatF 178 signal are both logic low values. The DSQF signal 186 may be the DSQF 90 signal of FIG. 7 and/or FIG. 10 in some systems. The output from the NOR gate 184 may be further delayed at an inverter 182B that enables, and thus transmits at its output, in response to an enable stage 1 signal generated based on a delay block 190 (e.g., inverter 182C, inverter 182D, inverter 182E, inverter 182F). Finally, another inverter 182G may invert an output from the inverter 182B and send a DQS stage 1 control signal 188 to the input buffer 104. The input buffer 104 may operate in response to receiving both the DQS stage 1 control signal 188 and the enable stage 1 192. As will be appreciated, an inverted EnSlow (EnSlowF) 92 from the delay block 190 may be transmitted to the DQ receiver enable circuitry 132. The EnSlowF 92 signal is the complement of the EnSlow 180 signal.

To elaborate further on the DQ receiver enable circuitry 132, FIG. 13 is a logic diagram of example circuitry used as the DQ receiver enable circuitry 132. The DQ receiver enable circuitry 132 may include combinational logic to transmit the RX enable signal 136 to the DQ receiver 62 in response to each phase of multiple data strobe signals (e.g., DQS<0:3>) being reset after a previous write memory operation. Indeed, the DQ receiver enable circuitry 132 may include a NOR gate 204A, an inverter 182H, a NOR gate 204B, a NAND gate 206, a NOR gate 204C, a NOR gate 204D, and an inverter 182I. The DQ receiver enable circuitry 132 may receive each of the DQS<0:3> signals 138 and the combinational logic of the DQ receiver enable circuitry 132 may delay generating an RX enable signal 136 until each of the DQS<0:3> are in a reset state. The DQ receiver 62 may turn on in response to the RX enable signal 136. Indeed, the RX enable signal 136 may be a control signal to turn on the DQ receiver 62, connect the DQ receiver 62 to a power supply, open or close a switch to suitably enable the DQ receiver 62, or the like. This may improve memory device 10 operation may reducing or eliminating the likelihood of incorrect data latching occurring in response to the input buffer 104 being disabled after a write operation for less time than it takes to reset the DQS 4-phase generator.

The NOR gate 204A may receive the DQS<2> signal 138C and the DQS<3> signal 138D and the NAND gate 206 may receive the DQS<0> signal 138A and the DQS<1> signal 138B. The output from the NOR gate 204A is inverted via the inverter 182H and is received as an input to NOR gate 204B. The NOR gate 204B also receives an output from the NAND gate 206 and an EnSlowF 92. The EnSlowF 92 may be the same signal from the delay block 190 of FIG. 12.

The NOR gate 204B may generate a logic high output when each of the inputs have a logic low value. The NOR gate 204B halting transmission of the RX enable signal 136 may synchronize the DQ0-4 receiver 62 operation with each of the DQS<0:3> signals 138. The output from the NOR gate 204B may transmit via the NOR gates 204C and 204D and via the inverter 182I before transmitting as the RX enable signal 136.

Figure 14:
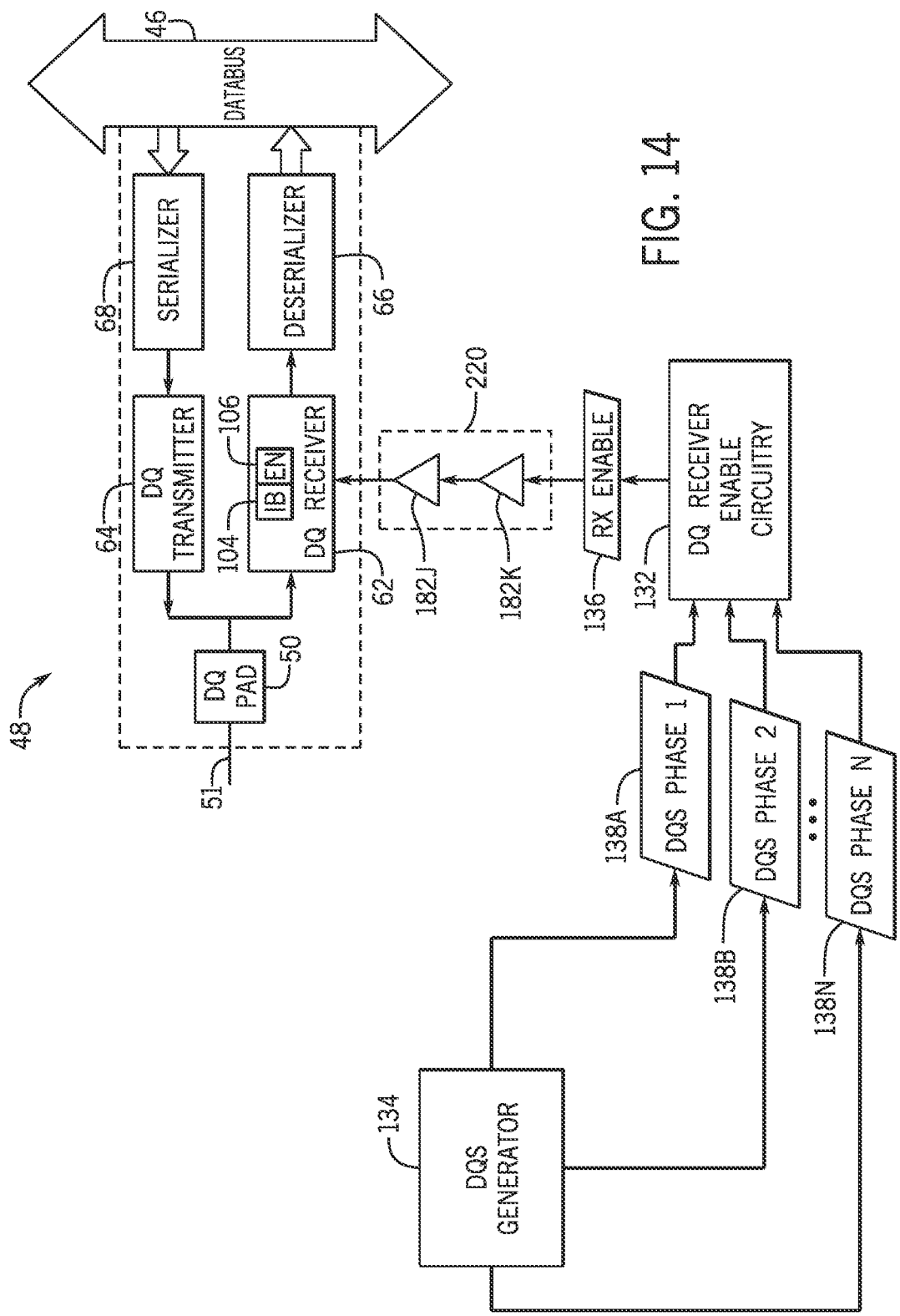
FIG. 14 is a block diagram of the I/O interface circuitry of FIG. 11 with additional delay circuitry, according to an embodiment of the present disclosure.

Keeping the foregoing in mind, in some memory devices 10 additional delay may be desired. FIG. 14 is an example block diagram of additional delay circuitry 220 included to further delay the RX enable signal 136. The additional delay circuitry 220 may include one or more inverters 182 (inverter 182J, inverter 182K) to further slow transmission of the RX enable signal to the DQ receiver 62.

Despite being illustrated as located in the input buffer enable circuitry, the delay block 190 may be disposed in any suitable location. For example, the delay block 190 may be disposed in circuitry common to each of the clock trees 168 and the DQ0-4 receivers 62, such as in the I/O interface 16.

Referring back to FIG. 10, in some embodiments, a timing of the EnSlowLatF 178 may be calibrated based on an individual implementation of the memory device 10 to enable suitable timing for synchronous operations. The calibration operations may occur during manufacturing. In some cases, performance of components over time may change. Thus, a memory controller may perform ongoing or periodic calibration operations to retime the transitions of the EnSlowLatF 178 to continue to preserve suitable synchronous operation.

Accordingly, the technical effects of the present disclosure include systems and methods that enable alignment of a receiver enable signal with DQS signals based on operations of input buffer enable circuitry and/or receiver enable circuitry. The input buffer enable circuitry may selectively enable the input buffer to receive the data signal based on the data strobe signal. By aligning the receiver operations with the DQS signals, such as by delaying enabling an input buffer and/or a receiver until one or more data strobe signals are reset to a reset voltage value (e.g., after a previous write memory operation), a likelihood of a false or incorrect data capture may be reduced, which may improve operation of a memory system by increasing the accuracy of distortion correction operations of a DFE.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a data pad configured to receive a data signal; and
a data receiver configured to couple to the data pad and comprising:
an input buffer, wherein the input buffer is configured to capture, when enabled, the data signal from the data pad; and
enable circuitry configured to selectively enable the input buffer to couple to the data pad based on a data strobe signal being reset after a previous write memory operation, wherein the data strobe signal corresponds to the data signal.

2. The device of claim 1, wherein the enable circuitry comprises a latch, and wherein the enable circuitry is configured to selectively couple the input buffer to the data pad based on the data strobe signal and an input buffer enable signal transmitted from the latch.

3. The device of claim 2, wherein the latch is configured to transmit the input buffer enable signal based on receiving an additional enable signal and based on the data strobe signal.

4. The device of claim 1, wherein the enable circuitry comprises a latch, a first inverter, a first not OR (NOR) gate, a second inverter, and a third inverter, wherein the latch is configured to couple to the first inverter and the first NOR gate, wherein the first NOR gate is configured to couple to the second inverter, wherein the second inverter is configured to couple to the third inverter, and wherein the third inverter is configured to couple to the input buffer.

5. The device of claim 4, comprising receiver enable circuitry configured to couple to the data receiver.

6. The device of claim 5, wherein the receiver enable circuitry is configured to generate a receiver enable signal based on a plurality of data strobe signals comprising the data strobe signal, and wherein the data receiver is configured to enable in response to the receiver enable signal.

7. The device of claim 6, wherein the receiver enable circuitry is configured to generate the receiver enable signal in response to each of the plurality of data strobe signals comprising a respective reset voltage level.

8. The device of claim 7, wherein the respective reset voltage level is configured based on a phase corresponding to that respective data strobe signal.

9. A memory device comprising:
a data strobe signal input pad configured to transmit a data strobe signal;

a first clock tree configured to couple to the data strobe signal input pad; and a first receiver configured to couple to the first clock tree and receive the data strobe signal via the first clock tree, wherein the first receiver comprises:

a data input pad configured to receive a data signal;

input buffer enable circuitry configured to generate an input buffer enable signal; and an input buffer configured to couple to the data input pad and capture, when enabled, the data signal from the data input pad based on the data strobe signal being reset after a previous write memory operation, wherein the data strobe signal corresponds to the data signal.

10. The memory device of claim 9, comprising a plurality of clock trees each configured to transmit a different respective phase of the data strobe signal to each of a plurality of input buffer enable circuitry as the data strobe signal, wherein the plurality of clock trees comprise the first clock tree, and wherein the plurality of input buffer enable circuitry comprise the input buffer enable circuitry.

11. The memory device of claim 9, wherein the input buffer enable circuitry comprises a latch, a first inverter, a first not OR (NOR) gate, a second inverter, and a third inverter, wherein the latch is configured to couple to the first inverter and the first NOR gate, wherein the first NOR gate is configured to couple to the second inverter, wherein the second inverter is configured to couple to the third inverter, and wherein the third inverter is configured to couple to the input buffer and output the input buffer enable signal to the input buffer.

12. The memory device of claim 9, comprising receiver enable circuitry configured to couple to the first receiver, wherein the receiver enable circuitry is configured to generate a receiver enable signal, and wherein the first receiver is configured to enable in response to the receiver enable signal.

13. The memory device of claim 9, comprising receiver enable circuitry configured to couple to the first receiver, wherein the receiver enable circuitry comprises combinational logic configured to transmit a receiver enable signal to the first receiver in response to each phase of a plurality of data strobe signals being reset after a previous write memory operation, and wherein the plurality of data strobe signals comprises the data strobe signal.

14. The memory device of claim 13, wherein the combinational logic is configured to transmit the receiver enable signal to the first receiver in response to each phase of the plurality of data strobe signals comprising the data strobe signal being reset after the previous write memory operation and in response to an enable signal used by the input buffer enable circuitry to generate the input buffer enable signal.

15. The memory device of claim 13, comprising delay circuitry to delay transmission of the receiver enable signal to the first receiver.

16. A memory device comprising:

clock distribution circuitry configured to generate a data strobe signal; and a first receiver configured to couple to at least a portion of the clock distribution circuitry and receive the data strobe signal from the clock distribution circuitry, wherein the first receiver comprises:

an input buffer configured to capture, when enabled, a data signal from a data pad; and input buffer enable circuitry configured to selectively enable the input buffer to capture the data signal based on the data strobe signal being reset after a previous write memory operation.

17. The memory device of claim 16, comprising receiver enable circuitry configured to couple to the first receiver, wherein the receiver enable circuitry comprises combinational logic configured to transmit a receiver enable signal to the first receiver in response to each phase of a plurality of data strobe signals comprising the data strobe signal being reset after a previous write memory operation.

18. The memory device of claim 17, wherein the combinational logic is configured to transmit the receiver enable signal to the first receiver in response to each phase of the plurality of data strobe signals comprising the data strobe signal being reset after the previous write memory operation and in response to an enable signal used by the input buffer enable circuitry to generate an input buffer enable signal.

19. The memory device of claim 16, wherein the clock distribution circuitry comprises a plurality of clock trees each configured to transmit a different respective phase of the data strobe signal to each of a plurality of input buffer enable circuitry as the data strobe signal.

20. The memory device of claim 16, wherein the input buffer enable circuitry comprises a latch, a first inverter, a first not OR (NOR) gate, a second inverter, and a third inverter, wherein the latch is configured to couple to the first inverter and the first NOR gate, wherein the first NOR gate is configured to couple to the second inverter, wherein the second inverter is configured to couple to the third inverter, and wherein the third inverter is configured to couple to the input buffer and send an enable signal to the input buffer.

* * * * *